United States Patent
Chung et al.

(10) Patent No.: US 10,529,289 B2
(45) Date of Patent: Jan. 7, 2020

(54) ELECTROLUMINESCENT DISPLAY

(71) Applicant: LG Display Co., Ltd., Seoul (KR)

(72) Inventors: Euihyun Chung, Paju-si (KR); Sunghun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/129,613

(22) Filed: Sep. 12, 2018

(65) Prior Publication Data

US 2019/0130846 A1    May 2, 2019

(30) Foreign Application Priority Data

Oct. 31, 2017   (KR) .......................... 10-2017-0143760

(51) Int. Cl.

| | |
|---|---|
| *G09G 3/20* | (2006.01) |
| *G09G 3/3291* | (2016.01) |
| *H01L 27/32* | (2006.01) |
| *G09G 3/3233* | (2016.01) |
| *G09G 3/3266* | (2016.01) |

(52) U.S. Cl.
CPC ......... *G09G 3/3291* (2013.01); *G09G 3/3233* (2013.01); *G09G 3/3266* (2013.01); *H01L 27/3265* (2013.01); *H01L 27/3276* (2013.01); *G09G 2300/043* (2013.01); *G09G 2300/0809* (2013.01); *G09G 2310/08* (2013.01)

(58) Field of Classification Search
CPC ..... G09G 2300/043; G09G 2300/0809; G09G 2300/0819; G09G 2300/0852; G09G 2300/0861; G09G 2300/0866; G09G 2310/0251; G09G 2310/08; G09G 3/3233; G09G 3/3266; G09G 3/3291; H01L 27/3265; H01L 27/3276
See application file for complete search history.

(56) References Cited

U.S. PATENT DOCUMENTS

| | | | |
|---|---|---|---|
| 8,120,553 B2 | 2/2012 | Kim | |
| 2004/0256617 A1* | 12/2004 | Yamada | G09G 3/325 257/59 |
| 2008/0180364 A1* | 7/2008 | Kim | G09G 3/3233 345/76 |

FOREIGN PATENT DOCUMENTS

| | | |
|---|---|---|
| KR | 10-2008-0070381 A | 7/2008 |
| KR | 10-2008-0102630 A | 11/2008 |
| KR | 10-2009-0119601 A | 11/2009 |

* cited by examiner

*Primary Examiner* — Insa Sadio
(74) *Attorney, Agent, or Firm* — Fenwick & West LLP

(57) ABSTRACT

An electroluminescent display is disclosed. Each of subpixels included in the electroluminescent display includes a first driver including a first driving element for driving a light emitting element during a first period, and a second driver including a second driving element for driving the light emitting element during a second period. The light emitting element includes an anode connected to the first and second drivers and a cathode supplied with a low potential power voltage. During the first period, a high potential power voltage higher than the low potential power voltage is supplied to the second driving element, and the low potential power voltage is supplied to the first driving element. During the second period, the high potential power voltage is supplied to the first driving element, and the low potential power voltage is supplied to the second driving element.

12 Claims, 13 Drawing Sheets

ELECTROLUMINESCENT DISPLAY

CROSS-REFERENCE TO RELATED APPLICATION

This application claims priority to Republic of Korea Patent Application No. 10-2017-0143760 filed on Oct. 31, 2017 with the Korean Intellectual Property office, which is incorporated herein by reference in its entirety.

BACKGROUND

Technical Field

The present disclosure relates to an electroluminescent display.

Discussion of the Related Art

An electroluminescent display is classified into an inorganic light emitting display and an organic light emitting diode (OLED) display depending on a material of an emission layer. An active matrix OLED display includes a plurality of OLEDs capable of emitting light by themselves and has many advantages of fast response time, high emission efficiency, high luminance, and wide viewing angle.

Each pixel of an OLED display includes an OLED and a driving element that supplies a current to the OLED depending on a gate-to-source voltage and drives the OLED. The OLED includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When the current flows in the OLED, holes passing through the hole transport layer HTL and electrons passing through the electron transport layer ETL move to the emission layer EML and combine, thereby forming excitons. As a result, the emission layer EML generates visible light by the excitons.

The driving element may be implemented as a transistor of a metal oxide semiconductor field effect transistor (MOSFET) structure. All the pixels have to have the same electrical characteristics in the driving element. However, there may be a variation in electrical characteristics between the pixels due to a process variation and a variation in device characteristics. Further, the electrical characteristics of the driving element may vary as a display driving time passed. In order to compensate for a variation in the electrical characteristics of the driving element, an internal compensation method and an external compensation method may be applied to an electroluminescent display. The internal compensation method samples a threshold voltage Vth of the driving element varying depending on the electrical characteristics of the driving element and compensates for a data voltage as much as the sampled threshold voltage Vth. The external compensation method senses a voltage of the pixel varying depending on the electrical characteristics of the driving element and modulates data of an input image based on the sensed voltage by an external circuit, thereby compensating for a variation in electrical characteristics of the driving element between the pixels.

Due to hysteresis characteristics of a transistor used as a driving element in an electroluminescent display to which an internal compensation circuit is applied, a threshold voltage Vth1 of the transistor when a current of the transistor increases may be different from a threshold voltage Vth2 of the transistor when the current of the transistor decreases. Change in the threshold voltage may generate a sampling variation in a threshold voltage of the driving element and lead to image retention. In FIG. 1, a horizontal axis denotes a gate voltage Vg of the transistor, and a vertical axis denotes a drain-to-source current Ids of the transistor. In FG. 1, the threshold voltage Vth1 when the Ids increases is be different from the threshold voltage Vth2 when the Ids decreases. Change in the threshold voltage resulting from the hysteresis characteristics of the transistor appears more in a p-channel transistor than an n-channel transistor.

SUMMARY

The present disclosure provides an electroluminescent display capable of preventing image retention.

An electroluminescent display according to the present disclosure includes a display panel on which data lines and gate lines intersect each other and a plurality of subpixels is disposed, a data driver configured to supply a data signal to the data lines, and a gate driver configured to supply a gate signal to the gate lines.

Each subpixel includes a first driver including a first driving element for driving a light emitting element during a first period, and a second driver including a second driving element for driving the light emitting element during a second period. The light emitting element includes an anode connected to the first and second drivers and a cathode supplied with a low potential power voltage.

During the first period, a high potential power voltage higher than the low potential power voltage is supplied to the second driving element, and the low potential power voltage is supplied to the first driving element. During the second period following the first period, the high potential power voltage is supplied to the first driving element, and the low potential power voltage is supplied to the second driving element.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
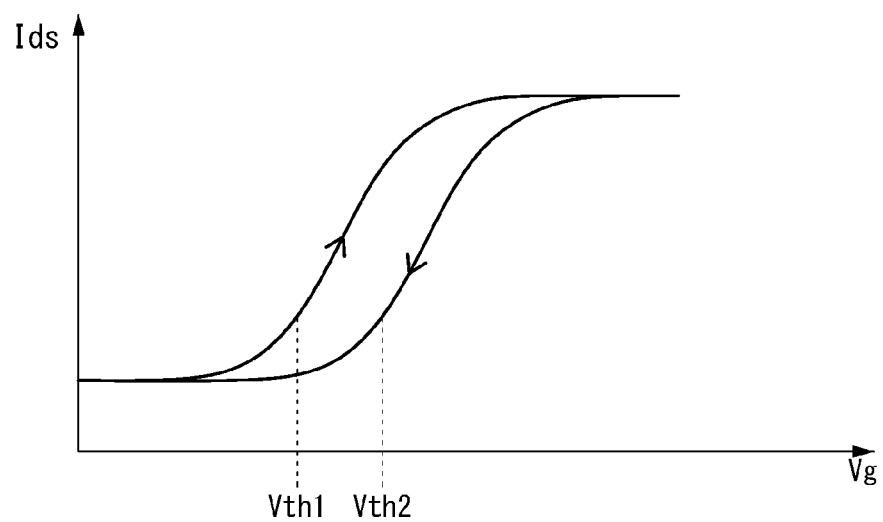
FIG. 1 illustrates change in a threshold voltage due to hysteresis characteristics of a transistor.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the present disclosure have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to distinguish various components. However, functions or structures of the components are not limited by names of the components and ordinal numbers prefixed to the component names.

The features of embodiments of the disclosure can be partially combined or entirely combined with each other, and can be technically interlocking-driven in various ways. The embodiments can be independently implemented, or can be implemented in conjunction with each other.

A pixel circuit included in an electroluminescent display according to embodiments of the disclosure includes a driving element and a switch element. Each of the driving element and the switch element may be implemented as at least one of an n-channel transistor (or n-type metal oxide semiconductor field effect transistor (MOSFET) (NMOS)) and a p-channel transistor (or p-type MOSFET (PMOS)). The transistor on a display panel may be implemented as a thin film transistor (TFT). The transistor may be implemented as an oxide transistor having an oxide semiconductor pattern or a low-temperature polycrystalline silicon (LTPS) transistor having a LTPS semiconductor pattern. The transistor is a three-electrode element including a gate, a source, and a drain. The source is an electrode for supplying carriers to the transistor. The carriers inside the transistor begin to flow from the source. The drain is an electrode from which carriers exit the transistor. Namely, carriers in the transistor flow from the source to the drain. In case of the n-channel transistor, because carriers are electrons, a source voltage is less than a drain voltage so that electrons can flow from a source to a drain. In the n-channel transistor, because electrons flow from the source to the drain, a current flows from the drain to the source. In case of the p-channel transistor, because carriers are holes, a source voltage is greater than a drain voltage so that holes can flow from a source to a drain. In the p-channel transistor, because holes flow from the source to the drain, a current flows from the source to the drain. In embodiments disclosed herein, the source and the drain of the transistor are not fixed. For example, the source and the drain of the transistor may be changed depending on an applied voltage. Thus, the present disclosure is limited by the source and the drain of the transistor. In the following description, the source and the drain of the transistor are referred to as a first electrode and a second electrode, respectively.

A gate signal of the transistor used as the switch element swings between a gate-on voltage and a gate-off voltage. The gate-on voltage is set to a voltage capable of turning on the transistor, and the gate-off voltage is set to a voltage capable of turning off the transistor. In case of an n-channel transistor, the gate-on voltage may be a gate high voltage VGH, and the gate-off voltage may be a gate low voltage VGL less than the gate high voltage VGH. In case of a p-channel transistor, the gate-on voltage may be the gate low voltage VGL, and the gate-off voltage may be the gate high voltage VGH.

In the following embodiments, an electroluminescent display will be described focusing on an organic light emitting diode (OLED) display including an organic light emitting material. However, the technical idea of the present disclosure is not limited to the OLED display. For example, the present disclosure may be applied to an inorganic light emitting display including an inorganic light emitting material.

Figure 2:
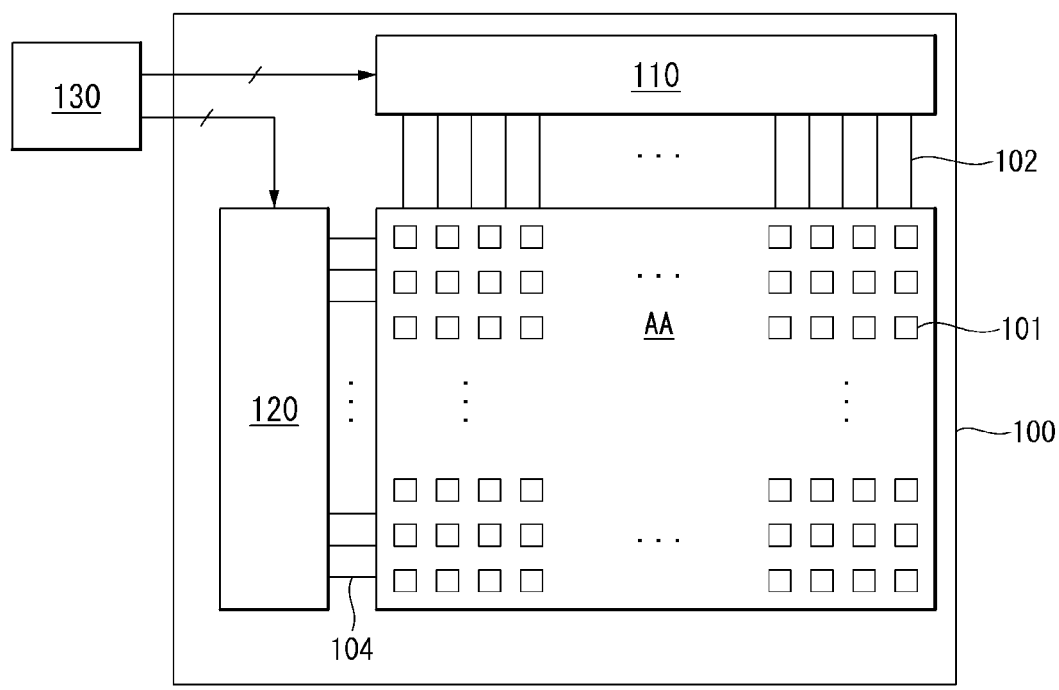
FIG. 2 is a block diagram of an electroluminescent display according to an embodiment of the disclosure.

FIG. 2 is a block diagram of an electroluminescent display according to an embodiment of the disclosure. Referring to FIG. 2, an electroluminescent display according to an embodiment of the disclosure includes a display panel 100 and a display panel driving circuit.

A screen of the display panel 100 includes a pixel array AA on which an input image is displayed. The pixel array AA includes a plurality of data lines 102, a plurality of gate lines 104 intersecting the data lines 102, and pixels arranged in a matrix.

Each pixel may include a red subpixel, a green subpixel, and a blue subpixel for color representation. Each pixel may further include a white subpixel. Each subpixel 101 includes a pixel circuit shown in FIGS. 3 to 8D. The pixel circuit drives a light emitting element OLED using two drivers connected to the light emitting element OLED.

Touch sensors may be disposed on the display panel 100. A touch input may be sensed using separate touch sensors or sensed through the pixels. The touch sensors may be implemented as on-cell touch sensors or add-on touch sensors and disposed on the screen of the display panel 100. Alternatively, the touch sensors may be implemented as in-cell touch sensors that are embedded in the pixel array AA.

The display panel driving circuit includes a data driver 110 and a gate driver 120. A demultiplexer (not shown) may be disposed between the data driver 110 and the data lines 102.

The display panel driving circuit writes data of an input image to the pixels of the display panel 100 under the control of a timing controller 130 and displays the input image on the screen. The display panel driving circuit may further include a touch sensor driver for driving the touch sensors.

The touch sensor driver is omitted in FIG. 1. In mobile devices or wearable devices, the data driver 110, the timing controller 130, and the like may be integrated into one integrated circuit.

The data driver 110 converts digital data of an input image received from the timing controller 130 into gamma compensation voltages using a digital-to-analog converter (DAC) in each frame period and outputs a voltage (hereinafter referred to as "data voltage") of a data signal. The data voltage is applied to the pixels through the data lines 102. The demultiplexer is disposed between the data driver 110 and the data lines 102 using a plurality of switch elements and distributes the data voltage output from the data driver 110 to the data lines 102. Because each channel of the data driver 110 is dividedly connected to the plurality of data lines 102 by the demultiplexer, the number of data lines 102 can decrease.

Figure 4:
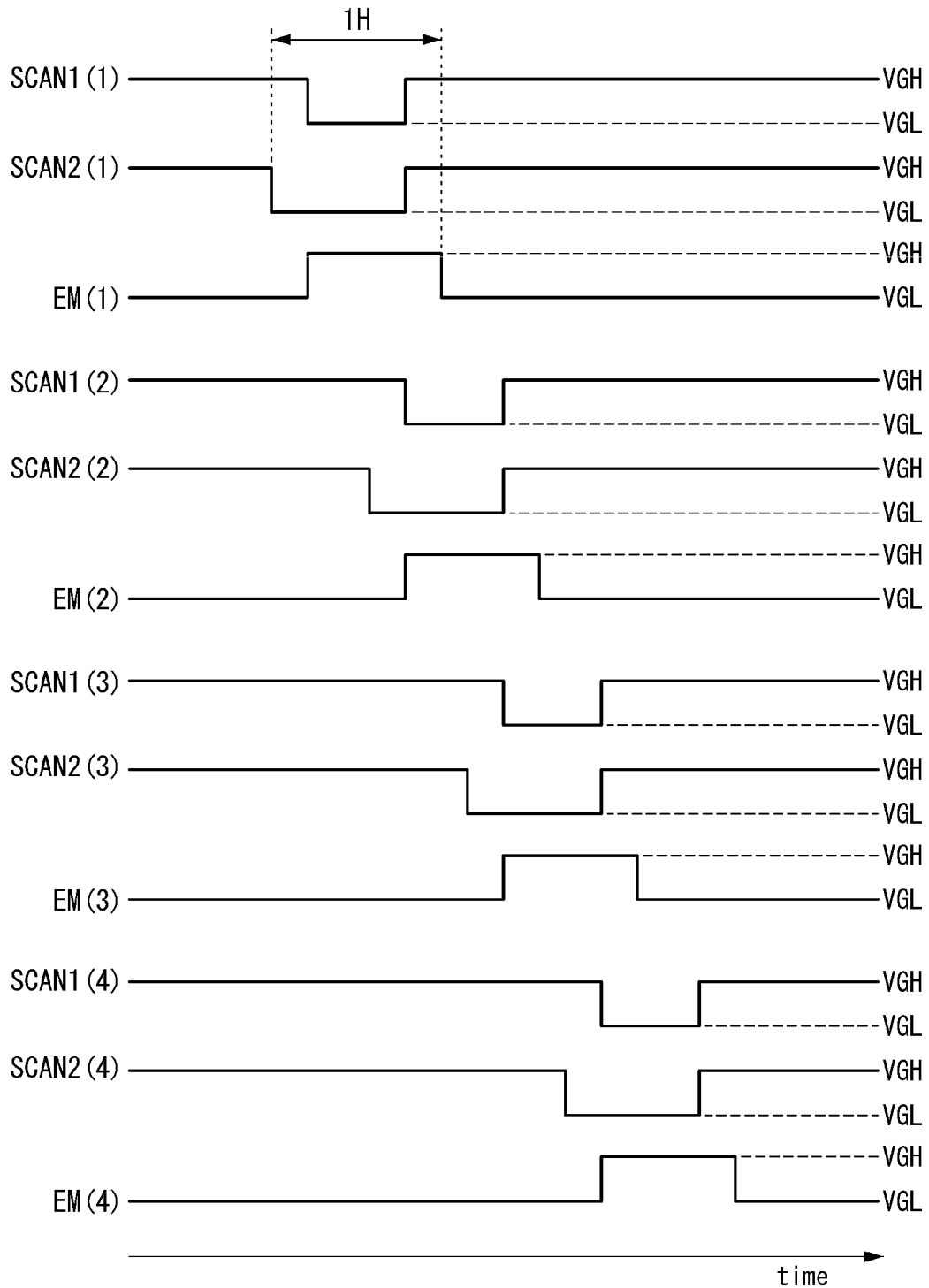
FIG. 4 is a waveform diagram illustrating a gate signal supplied to pixels of first to fourth display lines according to an embodiment of the disclosure.

The gate driver 120 may be implemented as a GIP (gate-in panel) circuit directly formed in a bezel area of the display panel 100 together with a transistor array of an active area. The gate driver 120 outputs gate signals to the gate lines 104 under the control of the timing controller 130. The gate driver 120 may shift the gate signals using a shift register and sequentially supply the gate signals to the gate lines 104. As shown in FIG. 4, the gate signal may include scan signals SCAN1(N) and SCAN2(N) and an emission signal EM(N).

The timing controller 130 receives digital video data DATA of an input image and timing signals synchronized with the digital video data DATA from a host system (not shown). The timing signals include a vertical sync signal Vsync, a horizontal sync signal Hsync, a data enable signal DE, a clock signal DCLK, and the like. The host system may be one of a television system, a set-top box, a navigation system, a personal computer (PC), a home theater system, a mobile device, a wearable device, and other systems that include or operate in conjunction with a display device.

The timing controller 130 may control a frame rate to be higher than an input frame frequency. For example, the timing controller 130 multiplies the input frame frequency by "i" and can control operation timing of the display panel driving circuit at a frame frequency of (input frame frequency×i) Hz, where "i" is a positive integer greater than zero. The input frame frequency is 50 Hz in a phase alternate line (PAL) scheme and is 60 Hz in a national television standards committee (NTSC) scheme. In a low power consumption driving mode, the timing controller 130 may reduce the frame frequency to 1 Hz to 30 Hz.

The timing controller 130 can generate a data timing control signal for controlling operation timing of the data driver 110, a switch control signal for controlling operation timing of the demultiplexer, and a gate timing control signal for controlling operation timing of the gate driver 120 based on the timing signals Vsync, Hsync, DE, and DCLK received from the host system, thereby controlling operation timing of the display panel driving circuit. A voltage level of the gate timing control signal output from the timing controller 130 may be converted into a gate-on voltage and a gate-off voltage through a level shifter (not shown) and may be supplied to the gate driver 120. The level shifter converts a low level voltage of the gate timing control signal into a gate low voltage VGL and converts a high level voltage of the gate timing control signal into a gate high voltage VGH.

Figure 3:
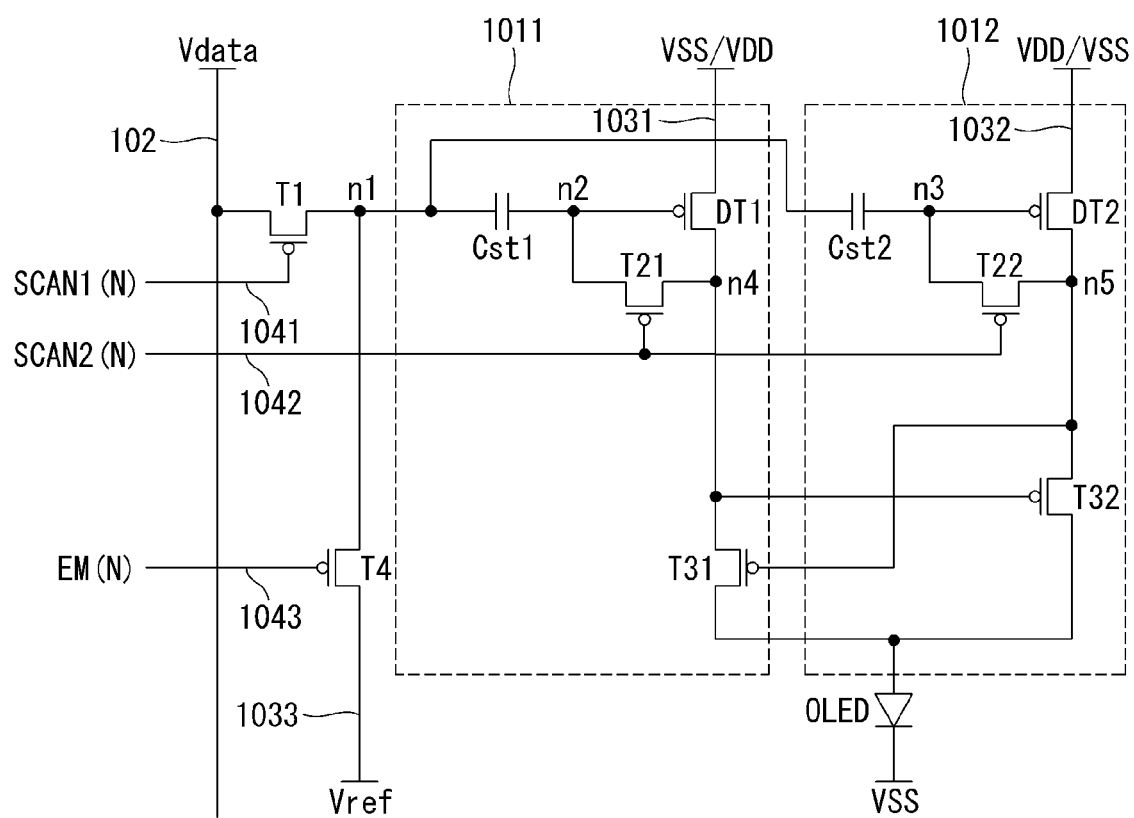
FIG. 3 is a circuit diagram of a pixel circuit according to a first embodiment of the disclosure.

FIG. 3 is a circuit diagram of a pixel circuit according to a first embodiment of the disclosure. The pixel circuit shown in FIG. 3 indicates any subpixel disposed on an Nth display line of the display panel 100, where N is a positive integer. FIG. 4 is a waveform diagram illustrating a gate signal supplied to pixels of first to fourth display lines. In FIG. 4, "1H" denotes one horizontal period.

Referring to FIGS. 3 and 4, the pixel circuit includes first and second drivers 1011 and 1012 for alternately driving a light emitting element OLED and a first switch element T1. The first driver 1011 includes a driving element DT1 and switch elements T21 and T31, and the second driver 1012 includes a driving element DT2 and switch elements T22 and T32. FIG. 3 illustrates that the driving elements DT1 and DT2 and the switch elements T1, T4, T21, T31, T22, and T32 are implemented as p-channel transistors, by way of example. However, embodiments are not limited thereto.

A data voltage Vdata, a high potential power voltage VDD, a low potential power voltage VSS, a reference voltage Vref, a first scan signal SCAN1(N), a second scan signal SCAN2(N), and an emission signal EM(N) are supplied to the pixel circuit. During a first period, the high potential power voltage VDD is supplied to the second driving element DT2, and the low potential power voltage VSS lower than the high potential power voltage VDD is supplied to the first driving element DT1. On the contrary, during a second period, the high potential power voltage VDD is supplied to the first driving element DT1, and the low potential power voltage VSS is supplied to the second driving element DT2. An anode of the light emitting element OLED is connected to the first and second drivers 1011 and 1012, and the low potential power voltage VSS is supplied to a cathode of the light emitting element OLED.

A pulse of the first scan signal SCAN1(N) is synchronized with the data voltage Vdata and defines a sampling period. The sampling period is time for which capacitors Cst1 and Cst2 of the pixel circuit are supplied with the data voltage Vdata and are charged with the data voltage Vdata compensated as much as a threshold voltage of the driving elements DT1 and DT2.

A pulse of the second scan signal SCAN2(N) overlaps the pulse of the first scan signal SCAN1(N) and is generated with a pulse width wider than the pulse of the first scan signal SCAN1(N). The pulse of the second scan signal SCAN2(N) is changed to a gate-on voltage VGL earlier than the first scan signal SCAN1(N) and is inverted to a gate-off voltage VGH at the same time as the first scan signal SCAN1(N), thereby defining an initialization period P01 and a sampling period P02 of the pixel circuit. The initialization period P01 is time for which the capacitors Cst1 and Cst2, the driving elements DT1 and DT2, and the light emitting element OLED of the pixel circuit are initialized. The pulses of the scan signals SCAN1(N) and SCAN2(N) are generated as the gate-on voltage VGL. A pulse of the emission signal EM(N) is inverted to the gate-off voltage VGH when the first scan signal SCAN1(N) is generated at the gate-on voltage VGL. The pulse of the emission signal EM(N) is inverted to the gate-on voltage VGL after the scan signals SCAN1(N) and SCAN2(N) are inverted to the gate-off voltage VGH and then are delayed by a hold period P03 of FIGS. 4 and 6. The emission signal EM(N) blocks a current flowing in the light emitting element OLED during the initialization period and the sampling period, thereby preventing the light emitting element OLED from emitting light. Further, the emission signal EM(N) forms a current path between the light emitting element OLED and the driving elements DT1 and DT2 in an emission period following the sampling period to thereby cause the light emitting element OLED to emit light.

The light emitting element OLED emits light with the current supplied from the first and second drivers 1011 and 1012. The anode of the light emitting element OLED is connected to the first and second drivers 1011 and 1012. The low potential power voltage VSS is supplied to the cathode of the light emitting element OLED. The light emitting element OLED may include an organic compound layer between the anode and the cathode. The organic compound layer may include a hole injection layer HIL, a hole transport layer HTL, an emission layer EML, an electron transport layer ETL, and an electron injection layer EIL. However, embodiments are not limited thereto.

A first switch element T1 forms a current path between the data line 102 and a first node n1 in response to the gate-on voltage VGL of the first scan signal SCAN1(N) and supplies the data voltage Vdata to the first and second drivers 1011 and 1012. The first switch element T1 is connected to the first and second drivers 1011 and 1012 and simultaneously supplies the data voltage Vdata to the capacitors Cst1 and Cst2 of the first and second drivers 1011 and 1012. The first switch element T1 includes a gate connected to a first gate line 1041 to which the first scan signal SCAN1(N) is applied, a first electrode connected to the data line 102, and a second electrode connected to the first node n1. The first node n1 is connected to the first switch element T1 and a fourth switch element T4 and is also connected to the first and second capacitors Cst1 and Cst2.

The first driver 1011 includes the first capacitor Cst1, the first driving element DT1, a 2-1 switch element T21, and a 3-1 switch element T31.

The first capacitor Cst1 is connected between the first node n1 and a second node n2 and samples a threshold voltage of the first driving element DT1', thereby storing a data voltage compensated as much as the sampled threshold voltage. The second node n2 is connected to a gate of the first driving element DT1 and a first electrode of the 2-1 switch element T21.

The first driving element DT1 controls the current of the light emitting element OLED depending on a voltage of the first capacitor Cst1 and drives the light emitting element OLED. The first driving element DT1 includes the gate connected to the second node n2, a first electrode connected to a first power line 1031, and a second electrode connected to a fourth node n4. The high potential power voltage VDD and the low potential power voltage VSS are alternately supplied to the first power line 1031 at predetermined time intervals. A The fourth node n4 is connected to the second electrode of the first driving element DT1, a second electrode of the 2-1 switch element T21, and a first electrode of the 3-1 switch element T31.

The 2-1 switch element T21 is turned on in response to the gate-on voltage VGL of the second scan signal SCAN2(N) and connects the gate and the second electrode of the first driving element DT1. The 2-1 switch element T21 includes a gate connected to a second gate line 1042 to which the second scan signal SCAN2(N) is applied, the first electrode connected to the second node n2, and the second electrode connected to the fourth node n4.

The 3-1 switch element T31 is turned off when a voltage of a fifth node n5 is equal to or greater than the gate-off voltage VGH, and blocks a current path between the first driving element DT1 and the light emitting element OLED when the second driver 1012 is driven. The 3-1 switch element T31 includes a gate connected to the fifth node n5, a first electrode connected to the fourth node n4, and a second electrode connected to the anode of the light emitting element OLED. When the second driver 1012 is driven, the 3-1 switch element T31 can prevent current consumption of the first driver 1011 and thus reduce power consumption.

The second driver 1012 operates alternately with the first driver 1011. The second driver 1012 includes the second capacitor Cst2, the second driving element DT2, a 2-2 switch element T22, and a 3-2 switch element T32.

The second capacitor Cst2 is connected between the first node n1 and the third node n3 and samples a threshold voltage of the second driving element DT2, thereby storing a data voltage compensated as much as the sampled threshold voltage. The third node n3 is connected to a gate of the second driving element DT2 and a first electrode of the 2-2 switch element T22.

The second driving element DT2 controls the current of the light emitting element OLED depending on a voltage of the second capacitor Cst2 and drives the light emitting element OLED. The second driving element DT2 includes the gate connected to the third node n3, a first electrode connected to a second power line 1032, and a second electrode connected to the fifth node n5. The high potential power voltage VDD and the low potential power voltage VSS are alternately supplied to the second power line 1032 at predetermined time intervals. The fifth node n5 is connected to the second electrode of the second driving element DT2, a second electrode of the 2-2 switch element T22, and a first electrode of the 3-2 switch element T32.

The 2-2 switch element T22 is turned on in response to the gate-on voltage VGL of the second scan signal SCAN2(N) and connects the gate and the second electrode of the second driving element DT2. The 2-2 switch element T22 includes a gate connected to the second gate line 1042 to which the second scan signal SCAN2(N) is applied, the first electrode connected to the third node n3, and the second electrode connected to the fifth node n5.

The 3-2 switch element T32 is turned off when a voltage of the third node n3 is equal to or greater than the gate-off voltage VGH, and blocks a current path between the second driving element DT2 and the light emitting element OLED when the first driver 1011 is driven. The 3-2 switch element T32 includes a gate connected to the third node n3, a first electrode connected to the fifth node n5, and a second electrode connected to the anode of the light emitting element OLED.

The pixel circuit may further include a fourth switch element T4. The fourth switch element T4 is turned on in response to the gate-on voltage VGL of the emission signal EM(N) and supplies the reference voltage Vref to the first node n1. The fourth switch element T4 includes a gate connected to a third gate line 1043 to which the emission signal EM(N) is applied, a first electrode connected to the first node n1, and a second electrode connected to a third power line 1033 to which the reference voltage Vref is applied.

The high potential power voltage VDD and the low potential power voltage VSS are alternately supplied to the first and second drivers 1011 and 1012. For example, the high potential power voltage VDD is supplied to the first driver 1011, and at the same time the low potential power voltage VSS is supplied to the second driver 1012. Subsequently, the power voltages VDD and VSS supplied to the first and second drivers 1011 and 1012 are switched between each other. The low potential power voltage VSS is supplied to the first driver 1011, and at the same time the high potential power voltage VDD is supplied to the second driver 1012. The power voltages VDD and VSS supplied to the first and second drivers 1011 and 1012 may be switched between each other at predetermined time intervals. The predetermined time interval may be one frame period. However, embodiments are not limited thereto. When the first driver 1011 is driven, the light emitting element OLED is driven with the data voltage compensated as much as the threshold voltage of the first driving element DT1 sampled for time at which a current Ids of the first driving element DT1 increases. Because the second driving element DT2 maintains an off-state when the first driver 1011 is driven, the threshold voltage of the second driving element DT2 is not sampled. Further, when the second driver 1012 is driven, the light emitting element OLED is driven with the data voltage compensated as much as the threshold voltage of the second driving element DT2 sampled for time at which a current Ids of the second driving element DT2 increases. Because the first driving element DT1 maintains an off-state when the second driver 1012 is driven, the threshold voltage of the first driving element DT1 is not sampled. Thus, the embodiment of the disclosure can prevent a sampling error of the threshold voltage resulting from hysteresis characteristics of the transistor because only the threshold voltage of the driving element supplied with the high potential power voltage VDD is sampled in each pixel circuit. As a result, the embodiment of the disclosure can prevent image retention resulting from the hysteresis characteristics of the transistor.

The high potential power voltage VDD may be a voltage higher than the low potential power voltage VSS, for example, DC voltage between 8V and 9V, and the low potential power voltage VSS may be 0V. Further, the data voltage Vdata may be 0V to 5V, and the reference voltage Vref may be a specific DC voltage between 1V and 2V. These voltages may vary depending on driving characteristics of the display panel, an application field, and the like. Thus, embodiments are not limited thereto.

Figure 5A:
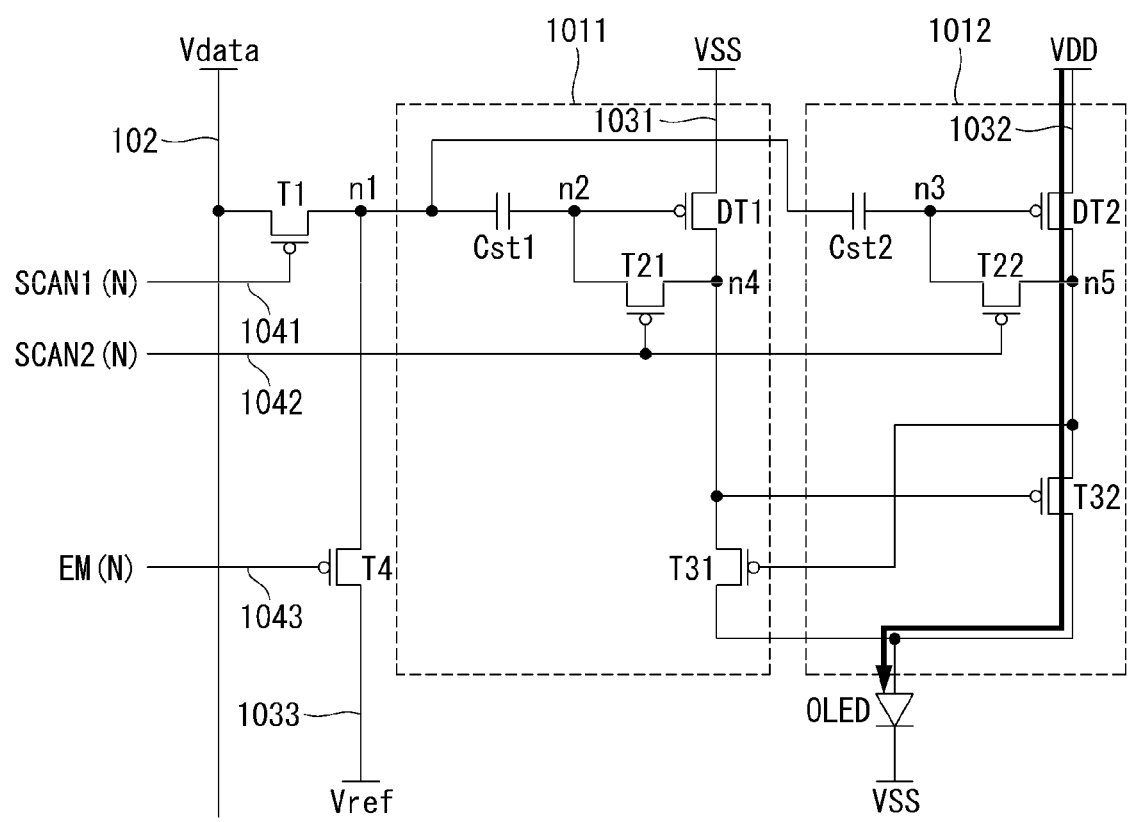
FIGS. 5A and 5B are circuit diagrams illustrating an operation of a pixel circuit shown in FIG. 3 according to an embodiment of the disclosure.
Figure 5B:
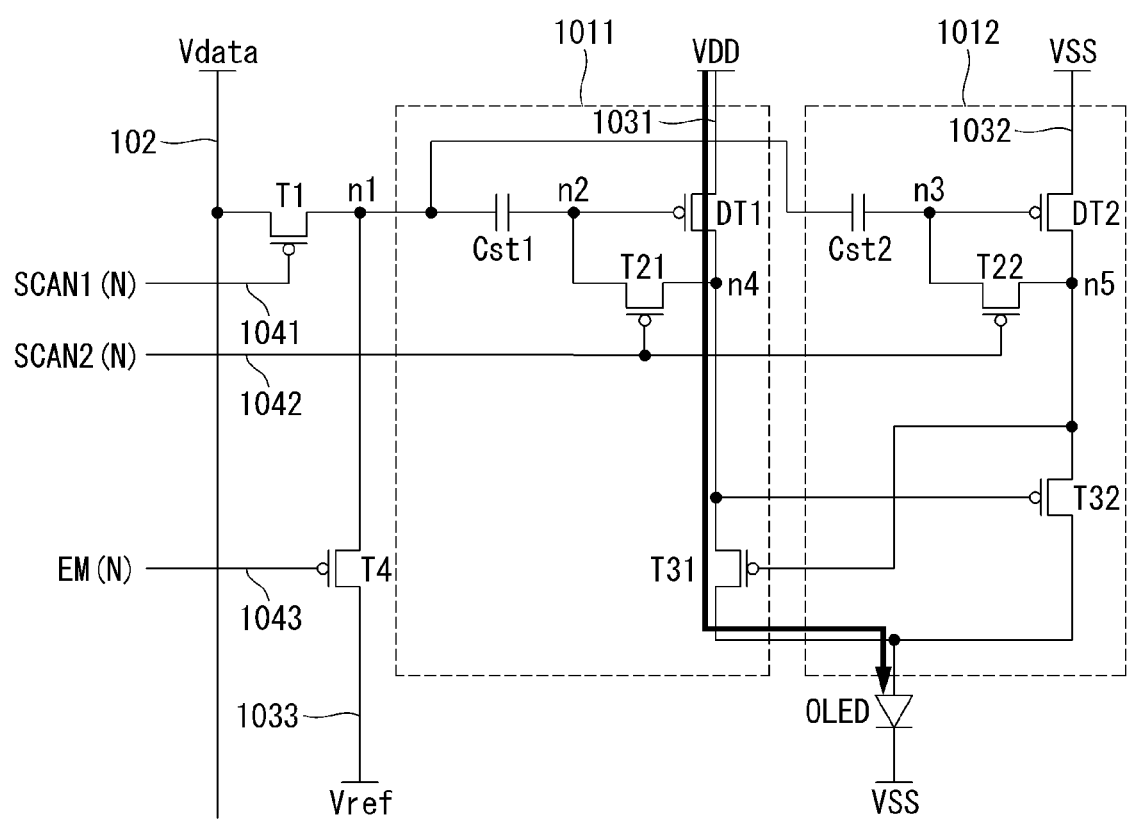
Figure 6:
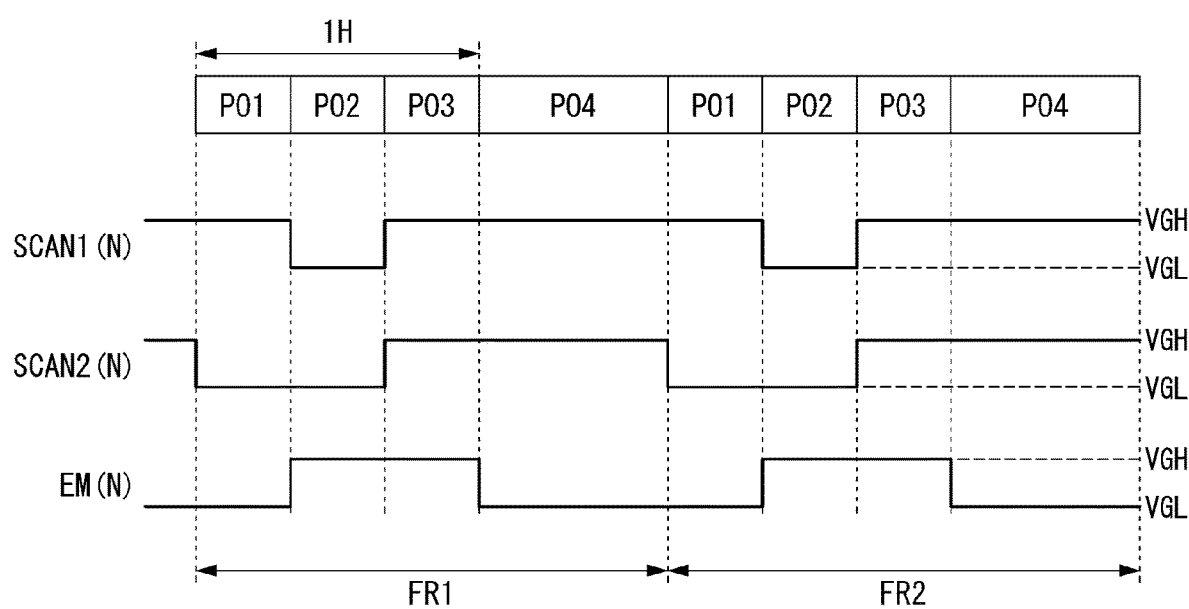
FIG. 6 is a waveform diagram illustrating a driving signal of a pixel circuit according to an embodiment of the disclosure.

FIGS. 5A and 5B are circuit diagrams illustrating an operation of the pixel circuit shown in FIG. 3. FIG. 6 is a waveform diagram illustrating a driving signal of a pixel circuit according to an embodiment of the disclosure.

Referring to FIGS. 5A, 5B, and 6, during a first period, the second driver 1012 is supplied with the high potential power voltage VDD and supplies the current to the light emitting element OLED. During the first period, the first driver 1011 is supplied with low potential power voltage VSS and is not driven because a current path connected to the light emitting element OLED is blocked in the first period. During a second period, the first driver 1011 is supplied with the high potential power voltage VDD and supplies the current to the light emitting element OLED. During the second, the second driver 1012 is supplied with low potential power voltage VSS and is not driven because a current path connected to the light emitting element OLED is blocked in the second period.

The first period may be a first frame period FR1 as shown in FIGS. 5A and 6, and the second period may be a second frame period FR2 as shown in FIGS. 5B and 6. However, embodiments are limited thereto. Each of the first and second periods is divided into an initialization period P01, a sampling period P02, a hold period P03, and an emission period P04. During the initialization period P01, the capacitors Cst1 and Cst2, the driving elements DT1 and DT2, and the light emitting element OLED of the pixel circuit are initialized. During the sampling period P02, the data voltage Vdata is supplied to the capacitors Cst1 and Cst2 of the pixel circuit, and the capacitors Cst1 and Cst2 are charged with a data voltage Vdata compensated as much as a threshold voltage of the driving elements DT1 and DT2. During the hold period P03, the scan signals SCAN1(N) and SCAN2(N) and the emission signal EM(N) maintain a previous state, and a voltage of each node of the pixel circuit holds a previous state. During the emission period P04, a current path is formed between the driving elements DT1 and DT2 and the light emitting element OLED, and the light emitting element OLED emits light with a luminance corresponding to grayscale of data.

Figure 7A:
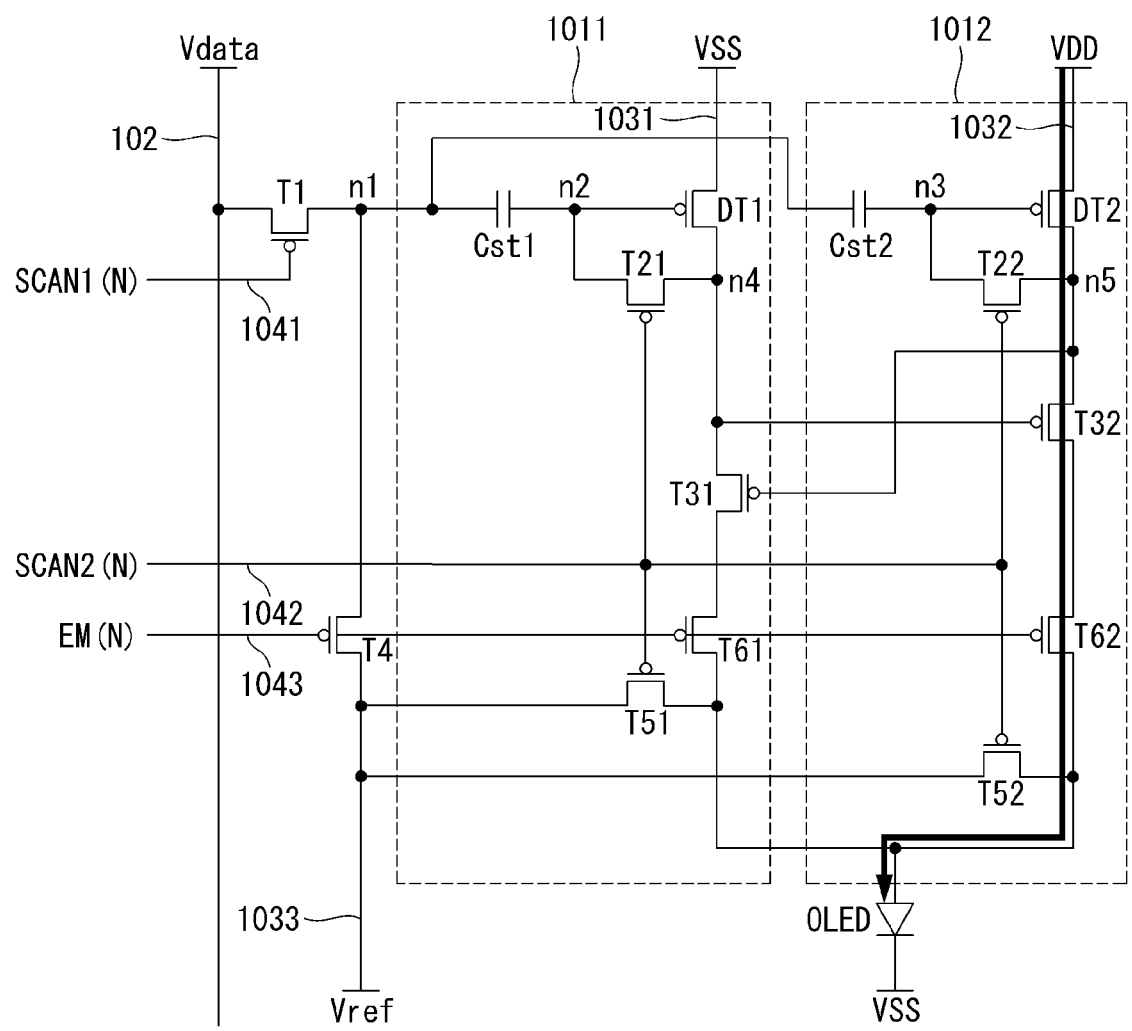
FIGS. 7A and 7B are circuit diagrams illustrating a pixel circuit according to a second embodiment of the disclosure.
Figure 7B:
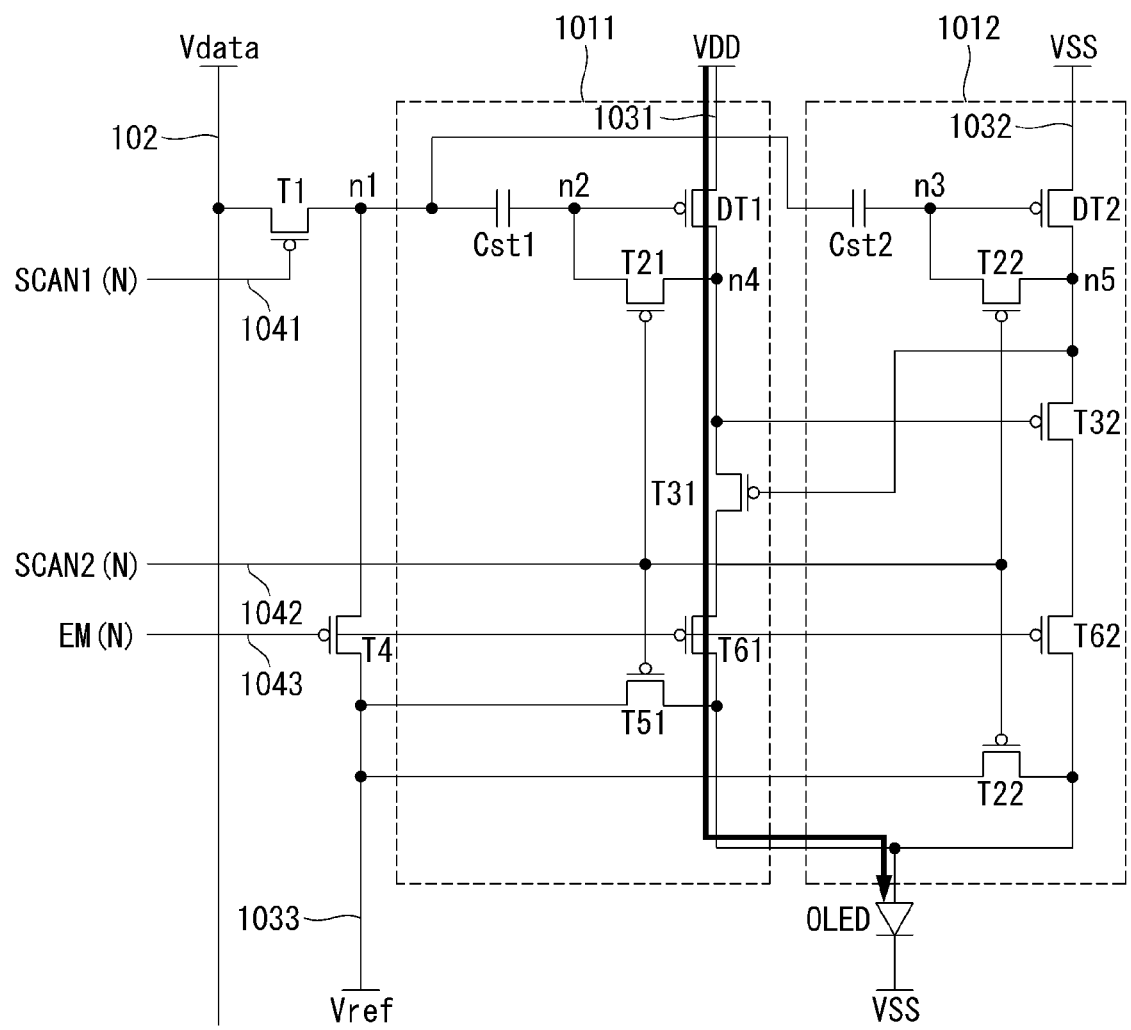

FIGS. 7A and 7B are circuit diagrams illustrating a pixel circuit according to a second embodiment of the disclosure. FIGS. 8A to 8D are circuit diagrams dividedly illustrating in stages an operation of a pixel circuit according to the second embodiment of the disclosure in an initialization period, a sampling period, a hold period, and an emission period. Structures and components identical or equivalent to those described in the first embodiment are designated with the same reference numerals in the second embodiment, and a further description may be briefly made or may be entirely omitted.

Referring to FIGS. 7A and 7B, each of first and second drivers 1011 and 1012 may further include fifth and sixth switches.

A 5-1 switch element T51 is turned on in response to a gate-on voltage VGL of a second scan signal SCAN2(N) and connects a third power line 1033 to an anode of a light emitting element OLED. Hence, the 5-1 switch element T51 fixes an anode voltage of the light emitting element OLED to a reference voltage Vref during an initialization period P01, a sampling period P02, and a hold period P03, thereby suppressing the emission of the light emitting element OLED. The 5-1 switch element T51 includes a gate connected to a second gate line 1042, a first electrode connected to the third power line 1033, and a second electrode connected to the anode of the light emitting element OLED.

A 5-2 switch element T52 is turned on in response to the gate-on voltage VGL of the second scan signal SCAN2(N) and connects the third power line 1033 to the anode of the light emitting element OLED. Hence, the 5-2 switch element T52 fixes the anode voltage of the light emitting element OLED to the reference voltage Vref during the initialization period P01, the sampling period P02, and the hold period P03, thereby suppressing the emission of the light emitting element OLED. The 5-2 switch element T52 includes a gate connected to the second gate line 1042, a first electrode connected to the third power line 1033, and a second electrode connected to the anode of the light emitting element OLED.

A 6-1 switch element T61 is turned on in response to the gate-on voltage VGL of an emission signal EM(N) during an emission period P04 and thus forms a current path between a 3-1 switch element T31 and the light emitting element OLED. For a period of time except the emission period P04, the 6-1 switch element T61 blocks the current path. The 6-1 switch element T61 includes a gate connected to a third gate line 1043, a first electrode connected to a second electrode of the 3-1 switch element T31, and a second electrode connected to the anode of the light emitting element OLED.

A 6-2 switch element T62 is turned on in response to the gate-on voltage VGL of the emission signal EM(N) during the emission period P04 and thus forms a current path between a 3-2 switch element T32 and the light emitting element OLED. For a period of time except the emission period P04, the 6-2 switch element T62 blocks the current path. The 6-2 switch element T62 includes a gate connected to the third gate line 1043, a first electrode connected to a second electrode of the 3-2 switch element T32, and a second electrode connected to the anode of the light emitting element OLED.

The high potential power voltage VDD and the low potential power voltage VSS are alternately supplied to the first and second drivers 1011 and 1012. For example, the high potential power voltage VDD is supplied to the first driver 1011, and at the same time the low potential power voltage VSS is supplied to the second driver 1012. Subsequently, the power voltages VDD and VSS supplied to the first and second drivers 1011 and 1012 are switched between each other. The low potential power voltage VSS is supplied to the first driver 1011, and at the same time the high potential power voltage VDD is supplied to the second driver 1012. The power voltages VDD and VSS supplied to the first and second drivers 1011 and 1012 may be switched between each other at predetermined time intervals. The predetermined time interval may be one frame period. However, embodiments are not limited thereto.

Figure 8A:
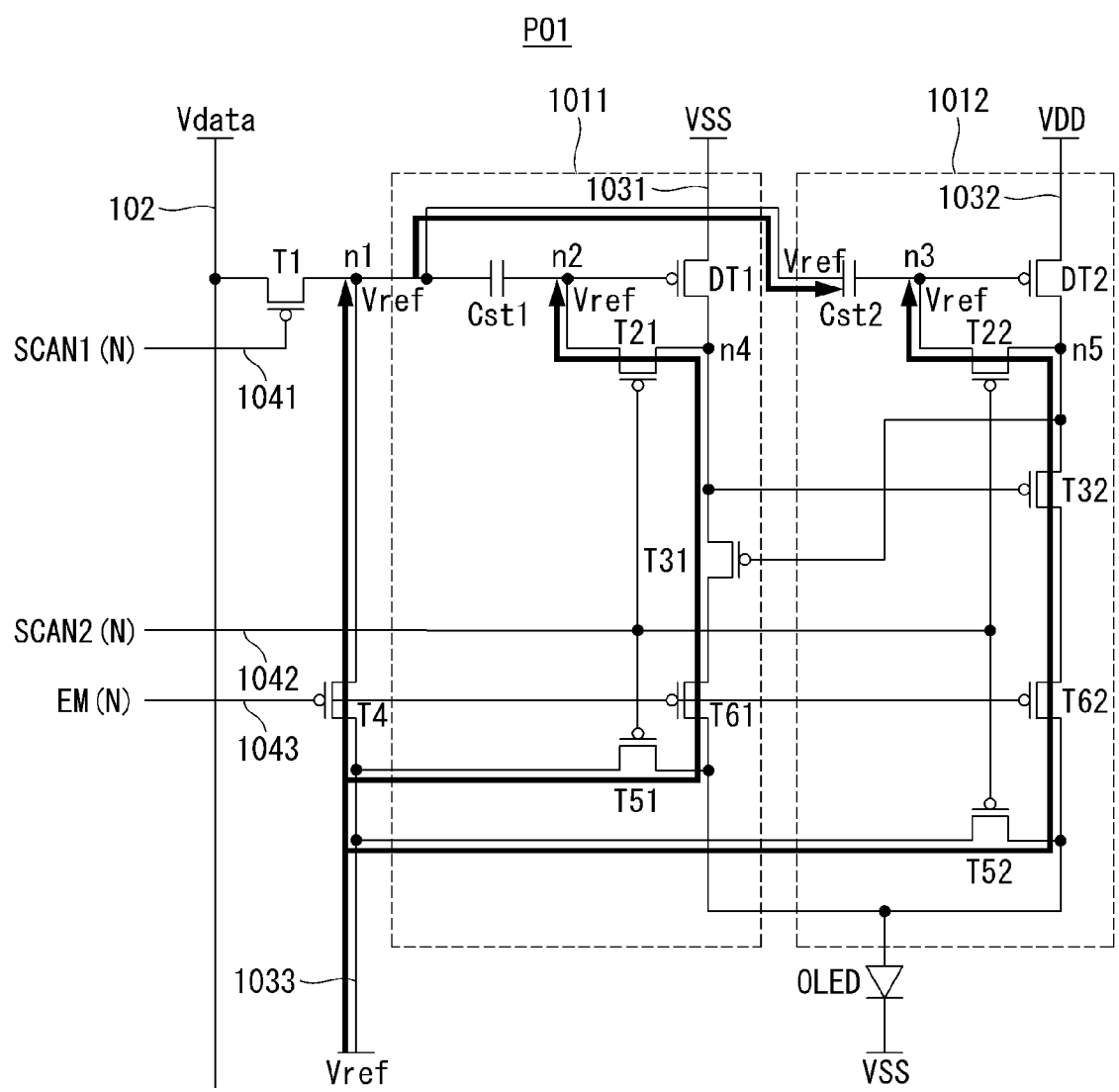
FIGS. 8A to 8D are circuit diagrams dividedly illustrating in stages an operation of a pixel circuit according to the second embodiment of the disclosure in an initialization period, a sampling period, a hold period, and an emission period.

A first period may be a first frame period FR1, and a second period may be a second frame period FR2. Each of the first and second periods is divided into an initialization period P01, a sampling period P02, a hold period P03, and an emission period P04. During the initialization period P01, the capacitors Cst1 and Cst2, the driving elements DT1 and DT2, and the light emitting element OLED of the pixel circuit are initialized. In the initialization period P01, as shown in FIG. 8A, main nodes of the pixel circuit are initialized to the reference voltage Vref.

Figure 8B:
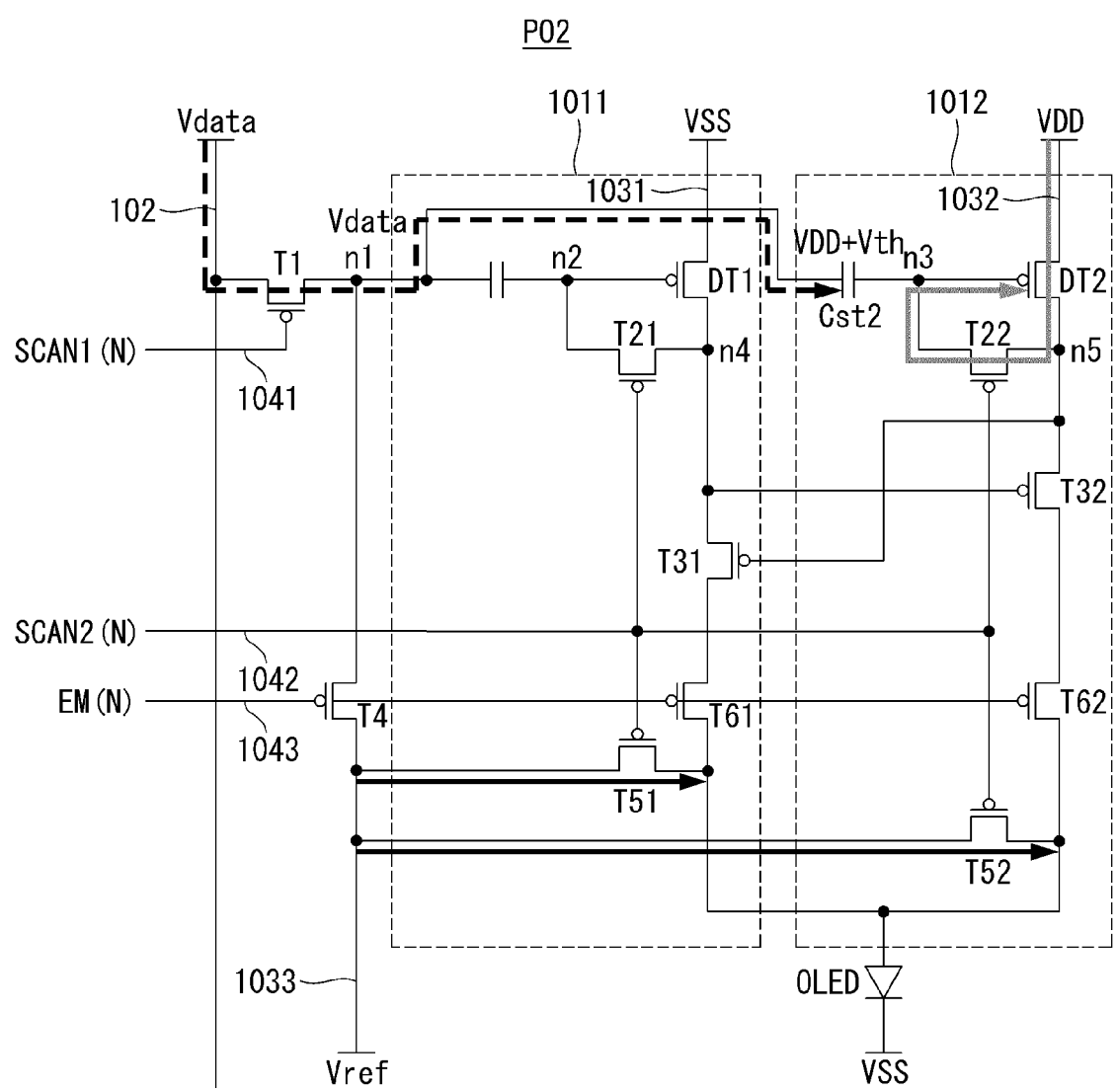
Figure 8C:
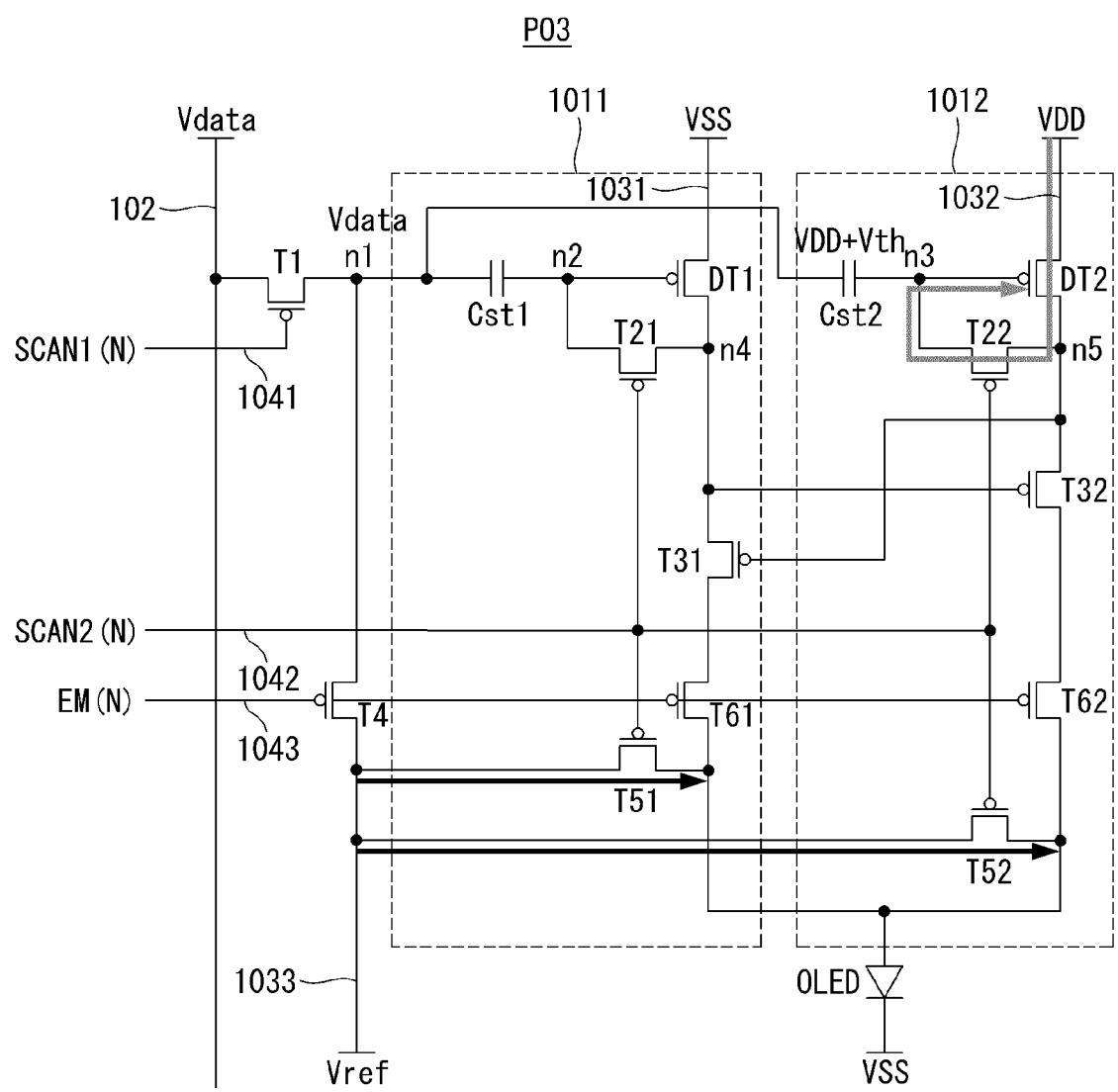
Figure 8D:
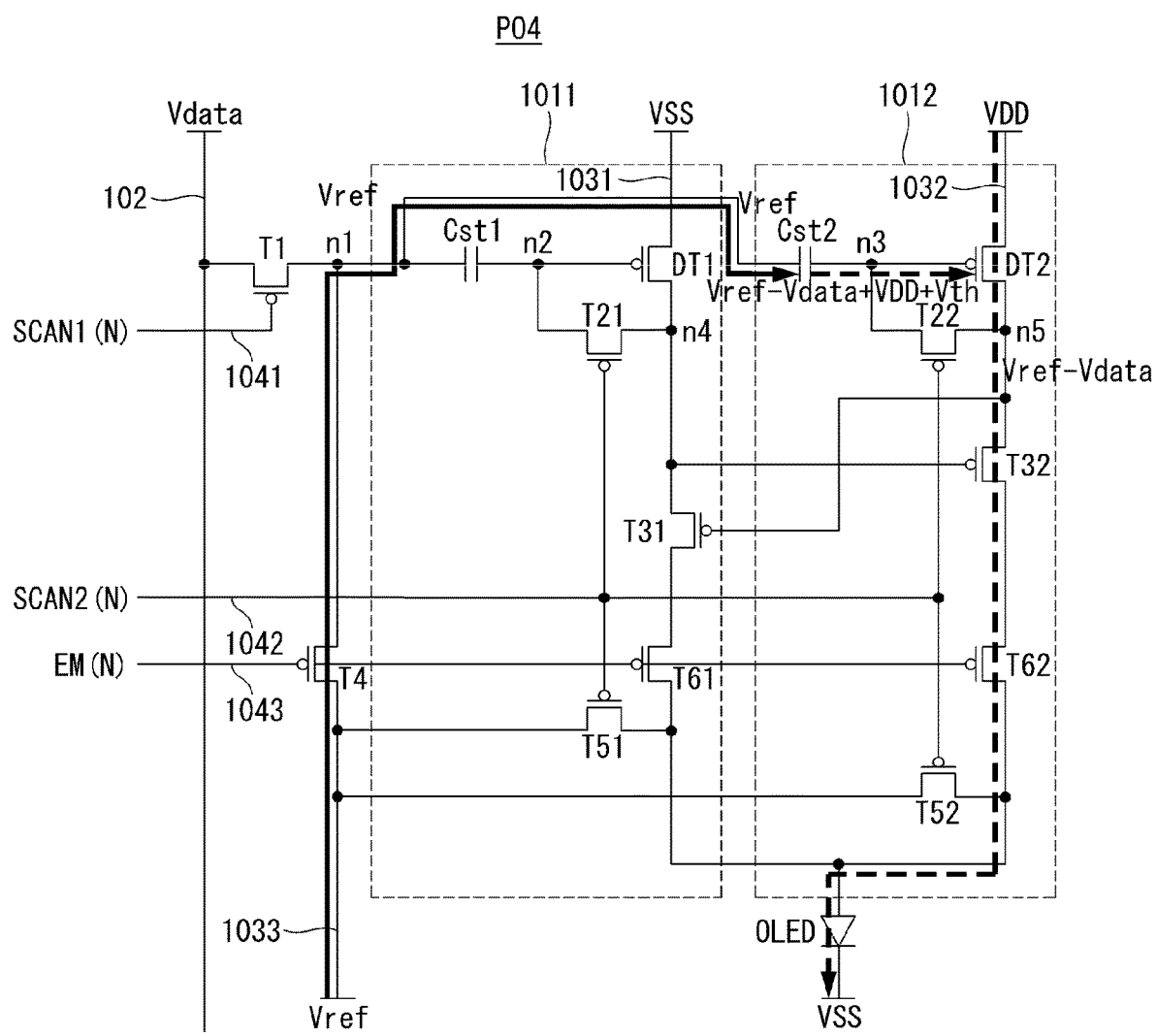

During the sampling period P02, the data voltage Vdata is supplied to the capacitors Cst1 and Cst2 of the pixel circuit, and the second driving element DT2 supplied with the high potential power voltage VDD is turned on. Hence, the second capacitor Cst2 is charged with a data voltage Vdata compensated as much as a threshold voltage of the second driving element DT2. When the second driver 1012 is driven, in the sampling period P02, as shown in FIG. 8B, a voltage of a third node n3 increases to "VDD+Vth", a threshold voltage Vth of the second driving elements DT2 is sampled, and the data voltage Vdata is applied to a first node n1. In this instance, the first driving element DT1 maintains an off-state because the low potential power voltage VSS is applied to a first electrode of the first driving element DT1. Therefore, the threshold voltage of the first driving element DT1 is not sampled. In the sampling period P02, a voltage of the first capacitor Cst1 holds an initialization voltage. During the hold period P03, the scan signals SCAN1(N) and SCAN2(N) and the emission signal EM(N) maintain a previous state, and a voltage of each node of the pixel circuit holds a previous state as shown in FIG. 8C.

During the emission period P04, a current path is formed between the driving elements DT1 and DT2 and the light emitting element OLED, and the light emitting element OLED emits light with a luminance corresponding to grayscale of data. When the second driver 1012 is driven, in the emission period P04, the voltage of the second capacitor Cst2 is "Vref−Vdata+VDD+Vth", and the voltage of the first capacitor Cst1 is held at the initialization voltage. When the first driver 1011 is driven, in the emission period P04, the voltage of the first capacitor Cst1 is "Vref-Vdata+VDD+Vth", and the voltage of the second capacitor Cst2 is held at the initialization voltage.

As described above, the electroluminescent display according to the embodiments of the disclosure is configured such that the first and second drivers, which are driven alternately with each other, are disposed in each pixel circuit, and only the threshold voltage of the driving element supplied with the high potential power voltage VDD among the first and second drivers is sampled. Hence, the embodiments of the disclosure can prevent a sampling error of the threshold voltage resulting from hysteresis characteristics of the transistor. As a result, the embodiments of the disclosure can prevent image retention resulting from the hysteresis characteristics of the transistor.

The electroluminescent display according to the embodiments of the disclosure is configured such that the two drivers are disposed in each subpixel, and a current path of the driver, which is not driven among the two drivers, is blocked. Hence, the embodiments of the disclosure can prevent additional current compensation even when the driver is added, and reduce power consumption.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. An electroluminescent display comprising:
a display panel on which data lines and gate lines intersect each other and a plurality of subpixels is disposed;
a data driver configured to supply a data signal to the data lines; and
a gate driver configured to supply a gate signal to the gate lines,
wherein each subpixel includes:
a first driver including a first driving element for driving a light emitting element during a first period; and
a second driver including a second driving element for driving the light emitting element during a second period,
wherein the light emitting element includes an anode connected to the first and second drivers and a cathode supplied with a low potential power voltage,
wherein during the first period, a high potential power voltage higher than the low potential power voltage is supplied to the second driving element, and the low potential power voltage is supplied to the first driving element,
wherein during the second period following the first period, the high potential power voltage is supplied to the first driving element, and the low potential power voltage is supplied to the second driving element.
2. The electroluminescent display of claim 1, wherein each of the first and second periods is a frame period.
3. The electroluminescent display of claim 1, wherein the gate signal includes:
a first scan signal generated as a pulse of a gate-on voltage synchronized with a data voltage and defining a sampling period;
a second scan signal overlapping the first scan signal and generated as a pulse of the gate-on voltage during an initialization period and the sampling period; and
an emission signal generated as a pulse of a gate-off voltage when the first scan signal is inverted to the gate-on voltage, and inverted to the gate-on voltage after the first and second scan signals are inverted to the gate-off voltage and then are delayed by a predetermined hold period,
wherein the gate driver supplies the first scan signal to the subpixels through a first gate line,
wherein the gate driver supplies the second scan signal to the subpixels through a second gate line, wherein the gate driver supplies the emission signal to the subpixels through a third gate line.

4. The electroluminescent display of claim 3, wherein each subpixel includes a first switch element that is turned on in response to the gate-on voltage of the first scan signal and supplies the data voltage to the first and second drivers.

5. The electroluminescent display of claim 4, wherein the first driver includes:
   a first capacitor disposed between a first node and a second node;
   a 2-1 switch element turned on in response to the gate-on voltage of the second scan signal and configured to connect the second node to a fourth node; and
   a 3-1 switch element configured to switch a current path between the third node and the light emitting element depending on a voltage of a fifth node present in the second driver,
   wherein the first capacitor is connected to the first switch element through the first node,
   wherein the first driving element includes a gate connected to the first capacitor through the second node, a first electrode which is supplied with the low potential power voltage during the first period and is supplied with the high potential power voltage during the second period, and a second electrode connected to the fourth node.

6. The electroluminescent display of claim 5, wherein the second driver includes:
   a second capacitor disposed between the first node and the third node;
   a 2-2 switch element turned on in response to the gate-on voltage of the second scan signal and configured to connect the third node to the fifth node; and
   a 3-2 switch element configured to switch a current path between the fifth node and the light emitting element depending on a voltage of the fourth node,
   wherein the second capacitor is connected to the first switch element through the first node,
   wherein the second driving element includes a gate connected to the second capacitor through a third node, a first electrode which is supplied with the high potential power voltage during the first period and is supplied with the low potential power voltage during the second period, and a second electrode connected to the fifth node.

7. The electroluminescent display of claim 6, wherein each subpixel further includes a fourth switch element that is turned on in response to the gate-on voltage of the emission signal and supplies a predetermined reference voltage to the first node.

8. The electroluminescent display of claim 7, wherein the first driver further includes:
   a 5-1 switch element configured to form a current path between a power line supplied with the reference voltage and the anode of the light emitting element depending on the gate-on voltage of the second scan signal; and
   a 6-1 switch element turned on in response to the gate-on voltage of the light emitting element and configured to form a current path between the 3-1 switch element and the anode of the light emitting element,
   wherein the second driver further includes:
   a 5-2 switch element configured to form a current path between the power line and the anode of the light emitting element depending on the gate-on voltage of the second scan signal; and
   a 6-2 switch element turned on in response to the gate-on voltage of the light emitting element and configured to form a current path between the 3-2 switch element and the anode of the light emitting element.

9. The electroluminescent display of claim 6, wherein during the sampling period, the first and second capacitors are supplied with the data voltage and are charged with the data voltage.

10. The electroluminescent display of claim 3, wherein the gate driver is configured such that a pulse of the second scan signal is generated with the pulse width wider than the pulse of the first scan signal, the pulse of the second scan signal is changed to the gate-on voltage earlier than the first scan signal and is inverted to a gate-off voltage at the same time as the first scan signal, to define the initialization period and the sampling period.

11. The electroluminescent display of claim 6, wherein during the initialization period, the first and second capacitors, the first and second driving elements and the light emitting element are initialized.

12. The electroluminescent display of claim 1, wherein when the first driver is driven, the light emitting element is driven with a data voltage compensated as much as a threshold voltage of the first driving element sampled for time at which a drain-source current of the first driving element increases; and when the second driver is driven, the light emitting element is driven with a data voltage compensated as much as a threshold voltage of the second driving element sampled for time at which a drain-source current of the second driving element increases.

* * * * *